(12) United States Patent
Van Der Pasch et al.

(10) Patent No.: US 9,316,928 B2
(45) Date of Patent: Apr. 19, 2016

(54) STAGE APPARATUS, LITHOGRAPHIC APPARATUS AND METHOD OF POSITIONING AN OBJECT TABLE

(75) Inventors: Engelbertus Antonius Fransiscus Van Der Pasch, Oirschot (NL); Emiel Jozef Melanie Eussen, Eindhoven (NL); Andre Bernardus Jeunink, Bergeijk (NL); Robbert Edgar Van Leeuwen, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 965 days.

(21) Appl. No.: 13/194,791

(22) Filed: Jul. 29, 2011

(65) Prior Publication Data

US 2012/0050709 A1     Mar. 1, 2012

Related U.S. Application Data

(60) Provisional application No. 61/376,928, filed on Aug. 25, 2010.

(51) Int. Cl.
    *G03B 27/54*           (2006.01)
    *G03B 27/58*           (2006.01)
    (Continued)

(52) U.S. Cl.
    CPC .......... *G03F 7/70775* (2013.01); *G03F 7/7085* (2013.01)

(58) Field of Classification Search
    CPC ............ G03F 7/70691; G03F 7/70733; G03F 7/70775; G03F 7/70833; G03F 7/7085; G03F 7/709
    USPC ........ 355/30, 52, 53, 55, 67–75, 77; 356/614, 356/616; 250/492.1, 492.2, 492.22, 493.1, 250/548
    See application file for complete search history.

(56) References Cited

U.S. PATENT DOCUMENTS 5,331,369 A * 7/1994 Terasawa et al. ................ 355/53
6,213,443 B1 * 4/2001 Wakui ........................... 248/550
(Continued)

FOREIGN PATENT DOCUMENTS

CN           1766740           5/2006
CN           1797212           7/2006
(Continued)

OTHER PUBLICATIONS

Japanese Office Action mailed Oct. 24, 2012 in corresponding Japanese Patent Application No. 2011-178719.

*Primary Examiner* — Christina Riddle
(74) *Attorney, Agent, or Firm* — Pillsbury Winthrop Shaw Pittman LLP

(57) ABSTRACT

A measurement system configured to measure a position dependent signal of an object table, the measurement system including at least one sensor mountable on the object table and a sensor target object mountable on a substantially stationary frame, and a mounting device configured to mount the sensor target object on the substantially stationary frame, wherein the measurement system further includes a compensator configured to compensate movements and/or deformations of the sensor target object with respect to the substantially stationary frame. The compensator may include a passive or an active damper and/or a feedback position controller. In an alternative embodiment, the compensator includes a gripping device which fixes the position of the sensor target object during a high accuracy movement of the movable object.

21 Claims, 5 Drawing Sheets

(51) Int. Cl.
*G03B 27/42* (2006.01)
*G03B 27/62* (2006.01)
*G03F 7/20* (2006.01)
*G03B 27/32* (2006.01)

(56) References Cited

U.S. PATENT DOCUMENTS

| | | |
|---|---|---|
| 7,265,813 B2 | 9/2007 | Houkes et al. |
| 7,388,663 B2 | 6/2008 | Gui |
| 7,483,120 B2 | 1/2009 | Luttikhuis et al. |
| 7,903,866 B2 | 3/2011 | Van Der Wijst et al. |
| 8,330,940 B2 | 12/2012 | Bijvoet |
| 2002/0149754 A1* | 10/2002 | Auer ................. G03F 7/709 355/53 |
| 2003/0159517 A1* | 8/2003 | Ito ................................. 73/662 |
| 2004/0137384 A1* | 7/2004 | Hara ............................ 430/434 |
| 2004/0227107 A1* | 11/2004 | Cox et al. ..................... 250/548 |
| 2005/0018162 A1* | 1/2005 | Leenders et al. ...... G03F 7/7085 355/67 |
| 2006/0092419 A1 | 5/2006 | Gui |
| 2006/0139613 A1 | 6/2006 | Houkes et al. |
| 2006/0139660 A1* | 6/2006 | Patrick Kwan ............... 356/614 |
| 2007/0263197 A1 | 11/2007 | Luttikhuis et al. |
| 2008/0035372 A1* | 2/2008 | Butler et al. ................ 174/84 R |
| 2008/0218713 A1 | 9/2008 | Shibazaki |
| 2008/0240501 A1* | 10/2008 | Van Der Wijst et al. ...... 382/103 |
| 2010/0007867 A1* | 1/2010 | Van Den Brink et al. ...... 355/72 |
| 2010/0079736 A1* | 4/2010 | Wada et al. ..................... 355/53 |
| 2010/0102413 A1 | 4/2010 | Bijvoet |
| 2010/0261106 A1* | 10/2010 | Kobayashi ..................... 430/30 |

FOREIGN PATENT DOCUMENTS

| | | |
|---|---|---|
| CN | 101246314 | 8/2008 |
| JP | H09-148237 | 6/1997 |
| JP | 2007-318119 | 12/2007 |
| JP | 2009-004737 | 1/2009 |
| JP | 2009252986 A2 | 10/2009 |
| JP | 2010-243413 | 10/2010 |
| JP | 2010245144 A2 | 10/2010 |
| TW | 200705136 | 2/2007 |
| TW | 200901048 | 1/2009 |
| WO | 2009/049826 | 4/2009 |
| WO | 2010143652 A1 | 12/2010 |

* cited by examiner

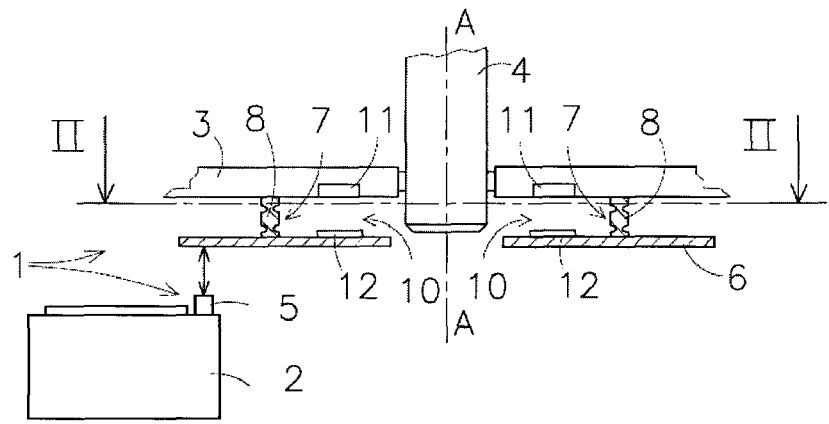
Figure 5    (I-I)
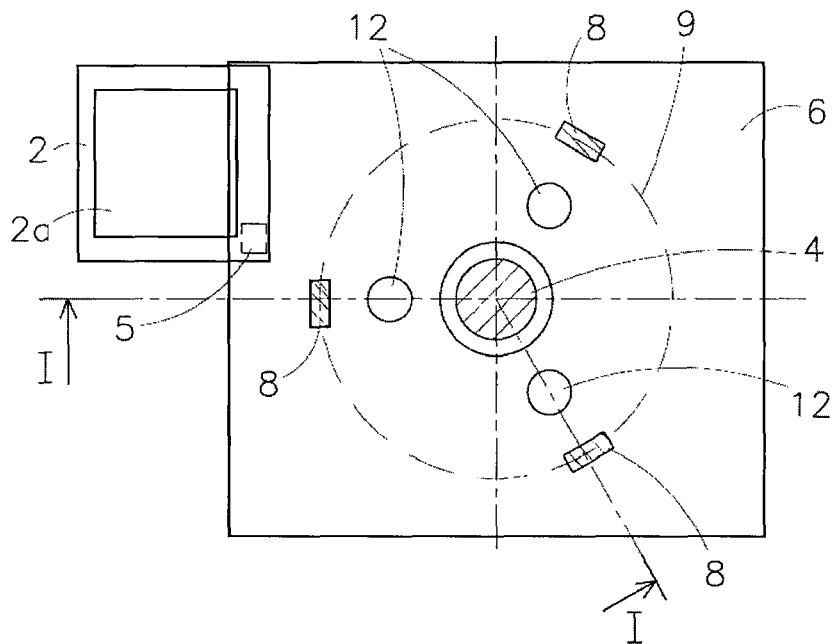
Figure 6    (II-II)

STAGE APPARATUS, LITHOGRAPHIC APPARATUS AND METHOD OF POSITIONING AN OBJECT TABLE

CROSS REFERENCE TO RELATED APPLICATIONS

This application claims priority and benefit under 35 U.S.C. §119(e) to U.S. Provisional Patent Application No. 61/376,928, entitled "Stage Apparatus, Lithographic Apparatus and Method Of Positioning An Object Table", filed on Aug. 25, 2010. The content of that application is incorporated herein in its entirety by reference.

FIELD

The present invention relates to a stage apparatus, a lithographic apparatus and a method of positioning an object table.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In the known lithographic apparatus, a stage apparatus is used to position an object table (e.g. holding a substrate or patterning device) relative to e.g. a metrology frame to which a projection system is mounted. Such a stage apparatus in general comprises a positioning system (e.g. comprising a long stroke coarse positioner and a short stroke fine positioner) for positioning the object table relative to the frame and a measurement system for determining the position of the object table relative to the frame with high accuracy (e.g. nanometer accuracy). Due to a continuing demand for higher throughput and increased accuracy, there is a need to improve the accuracy of measurement systems used in the lithographic apparatus, in particular for the measurement systems with which the position of the substrate stage and reticle stage are measured, and typically in six degrees of freedom.

In a known embodiment of the measurement system an encoder type measurement system is used. Such encoder-type measurement system may comprise one or more sensors mounted on the movable object and at least one sensor target object, for instance a sensor target plate comprising a grating or grid, the sensor target object mounted on a substantially stationary frame, in particular a so-called metrology frame (metro-frame). The sensor target object may comprise a one-dimensional or multi dimensional grating. The sensor target object will be typically in the form of a plate on which a two dimensional orthogonal grid is arranged. Such sensor target object is often referred to as grid plate.

In alternative embodiments, the one or more sensors may be mounted on the substantially stationary frame and the grid plate or the grid plates may be mounted on the movable object. The grid plate comprises a number of grid lines or other grid markings which are used to determine a change in position of the grid plate with respect to the one or more sensors.

A conventional measurement system comprises a mounting device for mounting the grid plate at a number of mounting points on the substantially stationary frame. Temperature changes and/or temperature differences in the metro frame may cause a change of shape of the metro-frame. Also other influences may cause shape changes of the metro-frame. As a result, the distance between the mounting points of the mounting device of the grid plate may change and, as a consequence, the change in shape of the metro-frame may also result in a change of shape of the grid plate. Such deformations may have a negative influence on the measurement accuracy of the measurement system.

In order to compensate for such shape changes of the metro-frame, the mounting device comprises a number of flexure elements which connect the grid plate to the metro-frame. These flexure elements are flexible in at least one degree of freedom in order to compensate the possible change in relative positions of the mounting points.

In a typical encoder-type measurement system for a substrate stage, a grid plate is mounted with three flexure elements which are arranged on the circumference of an imaginary circle drawn about the central axis of the lens column of the lithographic apparatus. The flexure elements allow movements of the metro-frame in radial direction with respect to the central axis of the lens column without transferring these movements to the grid plate. As the metro-frame is typically designed to deform circle-symmetrically about the central axis of the lens column, the grid plate will substantially remain in its position due to the flexure elements.

A drawback of the known measurement system is that since the mounting device of the grid plate, in particular the flexure elements, introduce some flexibility in the mounting of the grid plate, the grid plate may be moved or deformed by external influences. For instance, movements of the substrate stage may cause pressure waves which may cause movements or deformations in the grid plate. Such movements and/or deformations have a negative influence on the performance of the measurement system. In other measurement systems similar effects may occur and may have a negative influence on the accuracy of the measurement system.

SUMMARY

It is desirable to provide a stage apparatus including a high accuracy measurement system, preferably of the encoder-type, for measuring a position dependent signal of a movable object, in which the accuracy of measurement is substantially less influenced by disturbances, in particular disturbances caused by movement of the object table.

According to an embodiment of the invention, there is provided a stage apparatus for positioning an object table relative to a substantially stationary frame the stage apparatus system comprising: an object table; a positioning device configured to position the object table relative to the substantially stationary frame; a measurement system configured to provide a first position dependent signal of the object table, the measurement system comprising: a first measurement system part mounted on the object table; a second measurement system part mounted on the substantially stationary frame, wherein, in use, the first and second part co-operate with each other to provide the first position dependent signal; a controller configured to generate a control signal to control the positioning device; a mounting device configured to mount the second measurement system part on the substantially stationary frame, a position sensor configured to provide a second position dependent signal representing a position of the second measurement system part relative to the substantially stationary frame, wherein the controller is arranged to receive, at an input terminal of the controller, the first and second position dependent signals, and wherein the control signal is based on both the first and second position dependent signal.

According to an embodiment of the invention, there is provided a lithographic apparatus comprising: an illumination system configured to condition a radiation beam; a patterning device support constructed to support a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate, a positioning device configured to position the substrate table or patterning device support relative to a substantially stationary frame to which the projection system is mounted; a measurement system configured to provide a first position dependent signal of the substrate table or patterning device support, the measurement system comprising: a first measurement system part mounted on the substrate table or patterning device support; a second measurement system part mounted on the substantially stationary frame, wherein, in use, the first and second part co-operate with each other to provide the first position dependent signal; a controller configured to generate a control signal to control the positioning device; a mounting device configured to mount the second part on the substantially stationary frame, a position sensor configured to provide a second position dependent signal representing a position of the second measurement system part relative to the substantially stationary frame, wherein the controller is arranged to receive, at an input terminal of the controller, the first and second position dependent signals, and wherein the control signal is based on both the first and second position dependent signal.

According to an embodiment of the invention, there is provided a method of positioning an object table relative to a substantially stationary frame using a positioning device for positioning the object table and a measurement system comprising a first measurement system part and a second measurement system part co-operating to provide a first position dependent signal of the object table, the method comprising: providing a first position dependent signal representing a position of the first measurement system part mounted on the object table relative to the second measurement system part mounted on the substantially stationary frame, providing a second position dependent signal representing a position of the second measurement system part relative to the substantially stationary frame, providing the first and second position dependent signals at an input terminal of a controller to control the positioning device, providing, by the controller, a control signal to control the positioning device, wherein the control signal is based on both the first and second position dependent signal.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 5 depicts schematically a side view of a stage apparatus according to an embodiment of the invention to measure the position of a substrate stage in a lithographic apparatus; and FIG. 6 depicts schematically a top view of the embodiment of FIG. 5;

DETAILED DESCRIPTION

Figure 1:
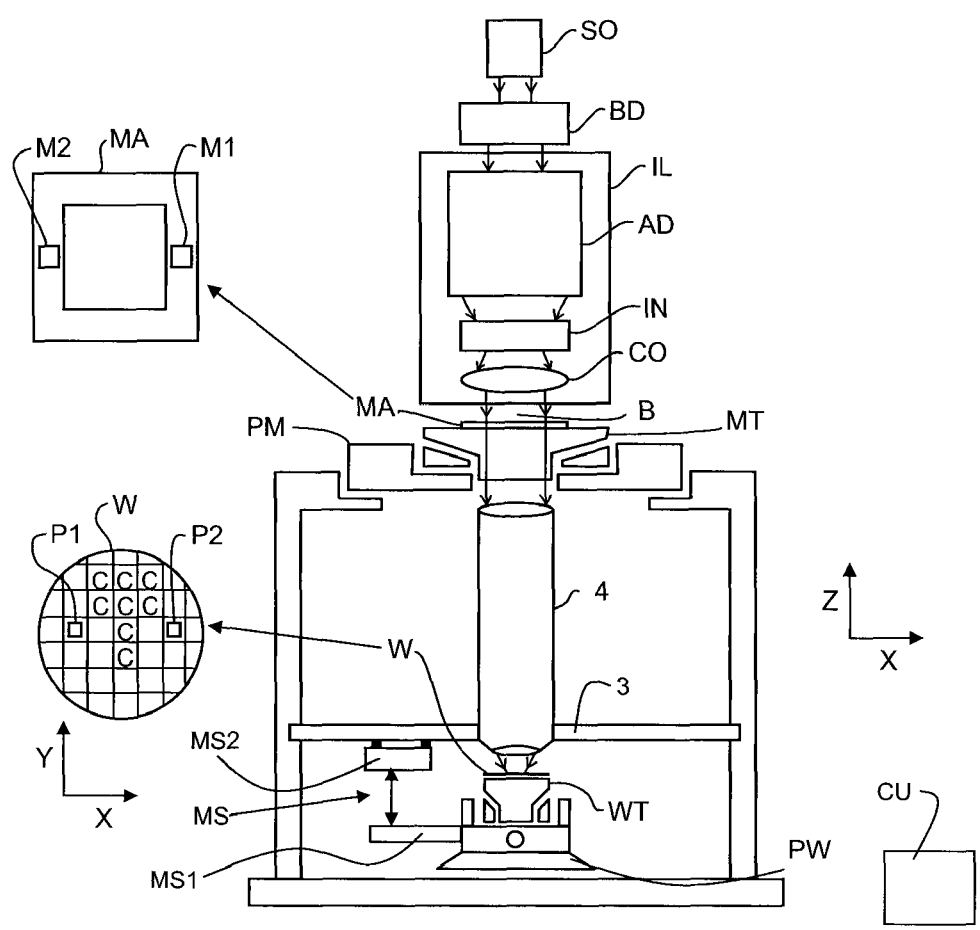
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support or support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system or lens column (e.g. a refractive projection lens system e.g. including a lens column) 4 configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device (e.g. mask) and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT, and is patterned by the patterning device. Having traversed the patterning device (e.g. mask) MA, the radiation beam B passes through the projection system 4, which focuses the beam onto a target portion C of the substrate W. With the aid of the second positioning device PW and measurement system MS (e.g. an encoder type measurement system), the substrate table WT can be moved accurately, e.g. so as to position different target portions C in the path of the radiation beam B. In accordance with an embodiment of the present invention, the measurement system MS is used to determine a position of the substrate table WT (or, in a similar manner, the mask support structure MT). In order to do this, the measurement system comprises a first measurement system part MS1 mounted to the substrate table WT (in general, the object table) and a second measurement system part MS2 mounted to a substantially stationary frame such as the metrology frame 3. In accordance with one embodiment, "mounting" of the system part MS2 relative to the substantially stationary frame is considered to include both a direct mounting, i.e. connecting of both parts or an indirect mounting whereby an intermediate device (i.e. a mounting device which can e.g. include a frame of leaf-springs) is used to connect both parts together. The measurement system MS is further arranged to provide a first position dependent signal representing a position of the first measurement system part MS1 relative to the second measurement system part MS2 to a controller CU configured to control the positioning device PW. The lithographic apparatus further comprises a position sensor (not shown) configured to provide a second position dependent signal representing a position of the second measurement system part (MS2) relative to the substantially stationary frame 3) to the controller CU. According to one embodiment of the invention, the controller CU is configured to provide a control signal to control the positioning device PW, whereby the control signal is based on both the first and second position dependent signal. As such, any displacements or deformations of the second measurement system part MS2 relative to the metrology frame 3, can, at least partly, be compensated or corrected for. As a result, a more accurate positioning of the object table (WT) relative to the projection system 4 can be obtained, resulting in a more accurate projection of the patterned beam onto the target portion C of the substrate W.

It will be appreciated that the displacements or deformations of the second measurement system part MS2 can be observed by various types of sensors and in different degrees of freedom. As an example, assuming the second measurement system part MS2 comprising a rectangular grating plate, four capacitive sensors or accelerometers may be applied to monitor a Z-position of the corners of the second measurement system part MS2 relative to the metrology frame.

Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a patterning device library, or during a scan. In general, movement of the patterning device support (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device support (e.g. mask table) MT may be connected to a short-stroke actuator only; or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

1. In step mode, the patterning device support (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the patterning device support (e.g. mask table) MT or "mask support" may be determined by the (de-)magnification and image reversal characteristics of the projection system 4. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
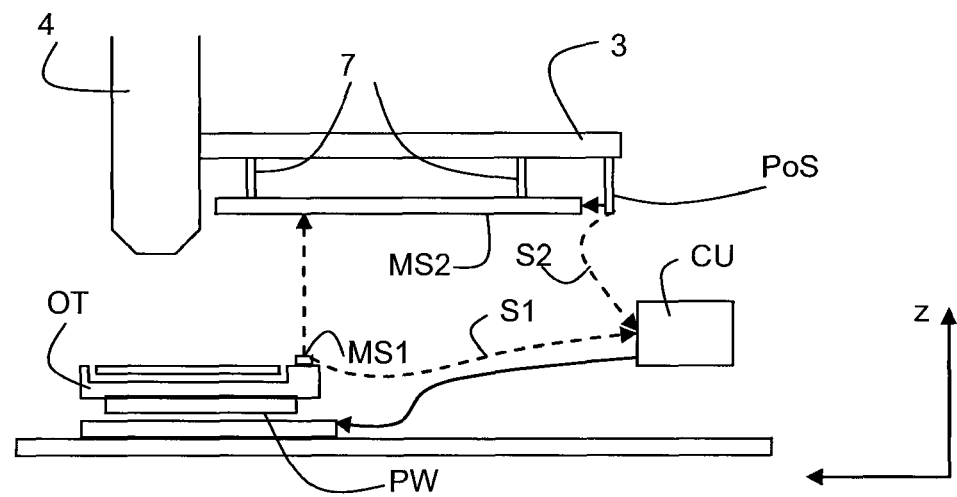
FIG. 2 schematically depicts a stage apparatus according to an embodiment of the invention.

In FIG. 2, a side view of one embodiment of a stage apparatus is schematically depicted. The stage apparatus comprises an object table OT and a positioning device PW configured to position the object table OT. The stage apparatus further comprises a measurement system having a first part MS1 (e.g. an encoder sensor) mounted to the object table and a second part MS2 mounted, using a mounting device 7, to a substantially stationary frame 3 of the stage apparatus. The measurement system is arranged to provide a first position dependent signal (S1) representing a position of the first measurement system part MS1 relative to the second measurement system part MS2 to a controller CU configured to control the positioning device PW. The stage apparatus further comprises a position sensor PoS configured to determine a position of the second part MS2 relative to the substantially stationary frame 3. Note that, in accordance with one embodiment of the present invention, the second part MS2 may be considered as a rigid body whereby the position can be characterized by a relative displacement (in x,y,z) and a rotation. Alternatively, the reference to a position of the second part MS2 may also refer to the shape or form of the second part MS2 whereby the position characterizes a deformation of the second part MS2. Such a deformation may be characterized by a plurality of position measurements of the second part MS2 relative to the frame 3. In accordance with one embodiment of the invention, the position sensor is configured to provide a second position dependent signal (S2) representing a position of the second measurement system part (MS2) relative to the substantially stationary frame 3 to the controller CU controlling the positioning device PW. The position sensor PoS can be arranged to measure a Z-position of the second part MS2 relative to the substantially stationary frame 3. As an example, the position sensor PoS may comprise one or more capacitive sensors. Capacitive sensor are particularly useful for observing comparatively low-frequent deviations (e.g. deviations caused by pressure-waves caused by movements of the object table, e.g. in a frequency range below 2 Hz). Also comparatively high frequency deviations may be picked up by such sensors, e.g. typical resonance modes of the second part MS2 in a frequency range ~200-400 Hz. As an alternative, accelerometers can be used as position sensors, whereby an acceleration of the second part MS2 is observed and, after a double integration, a signal representing the position of the accelerometer (and thus the object to which it is attached to) becomes available. Typically, accelerometers are preferred to observe deviations at comparatively high frequency, >1 kHz. As yet another alternative, encoder based position sensors may equally be applied. In such an arrangement, the position sensor PoS can comprise a grating mounted to the second measurement system part MS2 and a detector co-operating with the grating, the detector being mounted to the stationary frame 3. Alternatively, the grating can be mounted to the stationary frame 3 whereas detector co-operating with the grating is mounted to the second measurement system part MS2. In an embodiment the position sensor is a pressure sensor. The pressure-waves caused by movements of the object table can be detected with an absolute or differential pressure sensor. A pressure sensor may be used to measure the pressure between the object table and first part MS1 or second part MS2 connected to the stationary frame 3. A further pressure sensor may be used to measure the pressure between the first part MS1 or second part M2 and the stationary frame 3. By comparing the pressures measured by the pressure sensor and the further pressure sensor, a force acting on the first part MS1 or second part MS2 can be determined. If the stiffness of the relevant part of the lithographic apparatus is known, for example the stiffness of the grating to the stationary frame 3, the deformation of the first part MS1 or second part MS2 can be determined. In an embodiment, a differential pressure sensor is used to measure the pressure difference directly. Pressure sensors may be located at multiple locations in the lithographic apparatus. In an embodiment, a combination of different types of sensors may prove useful in assessing deviations (i.e. displacements or deformations) of the second measurement system part MS2 over a particular frequency range.

In an embodiment, the measurement system as applied in the stage apparatus is an encoder based measurement system, which may enable determining a position of the object table OT in six degrees of freedom. In such an arrangement, the object table can be provided with a plurality of sensors forming the first measurement system part MS1, the sensors co-operating with one or more grid plates or gratings forming the second measurement system part MS2, the second part MS2 being mounted to the substantially stationary frame 3 by a mounting device. Alternatively, one or more gratings may form the first measurement system part MS1 that is mounted to the object table whereas the second measurement system part MS2 comprises a sensor array co-operating with the one or more gratings. Such a sensor array may be mounted to the frame 3 in a similar manner as a gridplate or grating.

In accordance with one embodiment of the present invention, the measurement system as applied may also be an interferometer based measurement system. In such embodiment, the first measurement system part MS1 may comprise one or more (laser) interferometers co-operating with one or more mirrors forming the second measurement system part MS2. Alternatively, the second measurement system part MS2 may comprise one or more (laser) interferometers co-operating with one or more mirrors forming the first measurement system part MS1.

In accordance with one embodiment of the present invention, the positioning device used for positioning the object table is controlled by both position dependent signals S1 and S2. In an embodiment, the position dependent signal S2 is applied to adjust or correct the signal S1 as obtained from the measurement system. As will be understood by the skilled person, the signal S1 may accurately represent the position of the object table relative to the frame 3, provided the second measurement system part MS2 is in a nominal position relative to the frame 3. When a deviation is observed, i.e. the second measurement system part MS2 not being in a nominal position relative to the frame 3, a correction can be applied to signal S1, the corrected signal S1 subsequently being applied by the controller to control the positioning device. In order to determine the desired correction or adjustment of the signal S1, a transformation of the signal S2 may be desired. As an example, the signal S2 may represent a deformation such as a rotation of the second measurement system part MS2. The effect of such a deformation on the position measured by the measurement system may depend on the geometry of the measurement system or may depend on the position of the object table. As such, a model or transfer function may be applied to a corrected S1 signal, based on an observed deviation (via signal S2) of the position of the second part MS2 relative to the frame 3.

Figure 3:
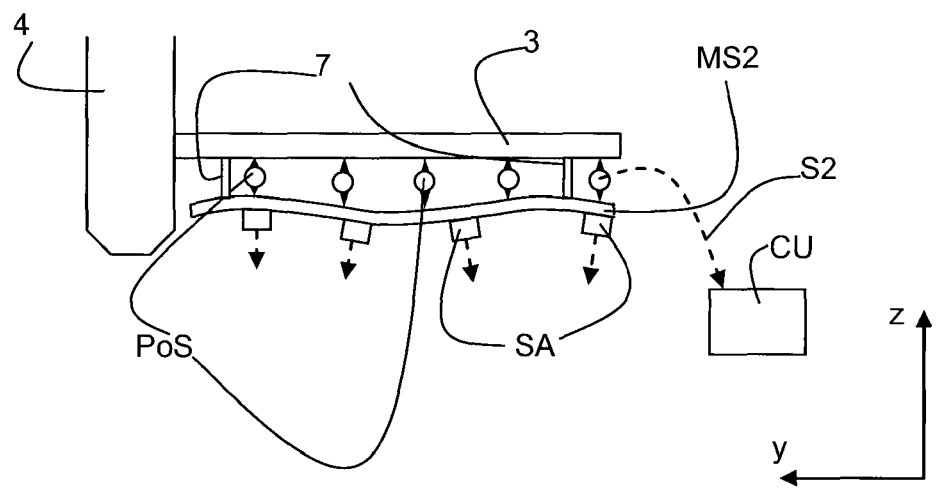
FIG. 3 schematically depicts a measurement system as can be applied in an embodiment of a stage apparatus.

As an example, the position sensor PoS may comprise an array of sensors (e.g. capacitive sensors) arranged along the second measurement system part MS2 that is mounted to the substantially stationary frame. Details of such an embodiment are schematically depicted in FIG. 3. In FIG. 3, the second measurement system part MS2 is mounted to the substantially stationary frame 3 by leaf springs forming the mounting device 7. In the embodiment, the second measurement system part MS2 comprises an array of sensors SA arranged to co-operate with a grating or gridplate mounted to an object table (not shown) for generating the first position dependent signal S1. The embodiment further comprises an array of position sensors PoS (e.g. capacitive sensors) arranged along the system part MS2 (in the y-direction) to measure a position (e.g. a z-position) of the system part MS2 relative to the frame 3. The output signals S2 of the position sensors PoS are provided to the controller CU and used, together with the signal S1 (not shown) provided by the measurement system, to provide a control signal to control a position of the object table (not shown). Using an array of position sensors PoS enables a more accurate calculation of the displacement or deformation of the second measurement system part MS2 and thus the effect of the displacement or deformation on the position measurement performed by the measurement system. As schematically shown in FIG. 3, a deformation of the system part MS2 may result in one or more sensors of the array of sensors SA no longer pointing along the Z-direction, which would be the normal measurement direction if the system part MS2 was not deformed. Using the signals S2 as obtained from the position sensors PoS, the shape of the measurement system part MS2 can be derived or estimated and the position dependent signal S1 can be corrected, taking the shape of the system part MS2 into account.

Figure 4:
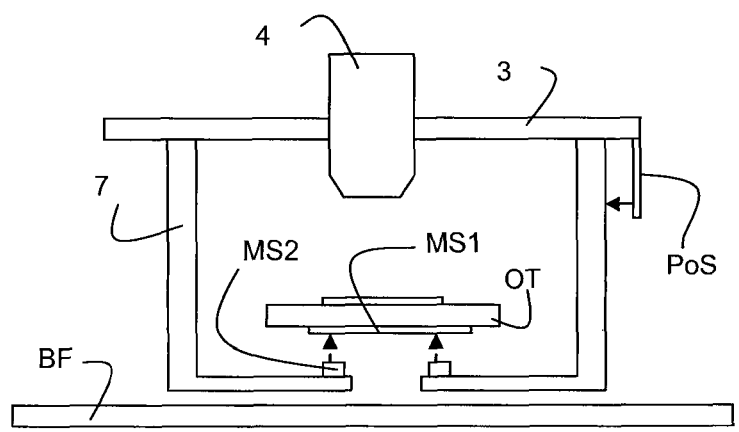
FIG. 4 schematically depicts a stage apparatus according to an embodiment of the invention.

The mounting device as used in one embodiment of the present invention for mounting the second measurement system part MS2 to the substantially stationary frame 3 may also be a comparative large and rigid structure, as illustrated in FIG. 4. In FIG. 4, the mounting device 7 comprises a pair or rigid arms that are mounted to the frame 3 and whereupon the measurement system part MS2 (e.g. an encoder based sensor) is mounted. The arms enable the measurement system (constituting of parts MS1, e.g. a grating mounted to the object table OT and MS2, e.g. an encoder sensor) to be positioned underneath the object table OT. In order to measure a deformation or displacement of the measurement system part MS2 relative to the substantially stationary frame 3. It will be appreciated that such a deformation or displacement may also be derived from a position measurement of the mounting device relative to the substantially stationary frame 3, this constituting, within the meaning of the present invention, an indirect measurement of a deformation or displacement of the measurement system part MS2 relative to the substantially stationary frame 3. As such, by observing (e.g. using a capacitive sensor or an accelerometer or an encoder based sensor) a position of the mounting device 7 relative to the frame 3, a position dependent signal S2 can be obtained from the position sensor PoS which can be applied to correct a position dependent signal S1 as obtained from the measurement system (MS1, MS2). The corrected position dependent signal may subsequently be used to displace the object table OT with a positioning device (not shown) mounted to a base frame BF.

In an embodiment, the stage apparatus or lithographic apparatus is further provided with a compensation device or compensator configured to at least partly mitigating a displacement or deformation of the second measurement part MS2, e.g. a 1D or 2D grid plate or grating or an encoder based sensor array. Such a compensation device or compensator can be integrated or part of the mounting device.

As will be explained in more detail below, the mounting device configured to mount the second measurement system part MS2 to the substantially stationary frame may comprise various components such as leaf-springs and compensating devices or compensators such as active or passive dampers or position control systems which can e.g. comprise one or more actuators configured to exert a force or torque on the second measurement system part MS2 in order to at least partly counteract a displacement or deformation of the second part MS2.

FIGS. 5 and 6 show a side view and bottom view of one embodiment of a measurement system and mounting device as can be applied in a stage apparatus or lithographic apparatus, the measurement system generally being indicated with the reference numeral 1. The measurement system 1 is configured to measure the position of a substrate stage 2, in general, an object table, supporting a substrate 2a with respect to a so-called metrology frame or metro-frame 3. The metro-frame 3 is a substantially stationary frame, to which the lens column 4, in general, the projection system, is mounted. In this respect it is remarked that a substantially stationary frame may be any frame which is passively or actively held in a substantially stationary position. The metro-frame 3 of a conventional lithographic apparatus is mounted with passive or active air-mounts on a base frame to filter any external disturbances such as vibrations in the factory floor. In this way the lens column is held in a substantially stationary position. During a scanning movement of the substrate stage, it is desired to know the position of the substrate stage with respect to the lens column. Therefore, a position measurement system 1 is provided with which the position of the substrate stage with respect to the metro-frame 3 can be determined.

The measurement system 1 comprises one or more sensors 5 which are used to determine the change in position of the substrate stage with respect to a sensor target object comprising a grating or grid, such as a sensor target plate. The sensor target object is, in the embodiment shown in FIGS. 5 and 6, a grid plate 6 comprising a two-dimensional grid. The grid plate 6 comprises a large number of grid lines or spots which are used for determining the position of the one or more sensors 5 with respect to the grid plate 6. The term grid plate as used in this application may refer to any type of sensor target object which is provided with a grid or grating as a part of a measurement system. Such measurement system is usually referred to as an encoder-type measurement system and is known in the art.

The grid plate 6 comprises a central hole for the lens column 4 and is mounted on the metro-frame 3 with a mounting device 7 comprising three flexure elements 8, e.g. leafsprings. The flexure elements 8 are arranged in a substantially horizontal plane at equal angles on the circumference of an imaginary circle 9. The center of the imaginary circle 9 substantially corresponds with the central axis A-A of a lens column 4 of the lithographic apparatus. The metro-frame 3 may change in shape due to temperature or other external influences. In the known lithographic apparatus this change in shape of the metro-frame is substantially symmetrical with the central axis of the lens column 4. The flexure elements 8 are arranged to allow the changes of the metro-frame 3 in radial directions with respect to the central axis of the lens column 4 without introducing a substantial shape change in the grid plate 6. A relative small change in the shape or position of the grid plate 6 may still occur. The direction of movement of the metro-frame sides of the flexure elements 8 is indicated with double-headed arrows in FIG. 6. Since the shape change of the metro-frame 2 is substantially symmetrical with respect to the central axis A-A of the lens column, the grid plate 6 will not be moved out of its position.

However, during the movement of the substrate stage 2 air is displaced in the working space of the substrate stage 2. As a result, pressure waves may propagate through the working space. These pressure waves may cause movements and/or deformations of the grid plate 6, in particular since the mounting device of the grid plate introduces some flexibility in the support of the grid plate. But even when a more stiff mounting of the grid plate 6 would be used the pressure waves may cause the grid plate 6 to move or deform.

In the embodiment of FIGS. 5 and 6, a compensating device or compensator comprising a damping device or damper 10 is provided at three locations to compensate these movements or deformations. In this respect it is remarked that the term compensate means that the movements and/or deformations of the grid plate are to a substantial extent suppressed by the provision of the damper or more generally by the compensator as applied. The damper 10 is a passive damper comprising a permanent magnet 11 which causes a force which is directed in the opposite direction with respect to a displacement of an element 12 for instance of aluminum being provided on the grid plate 6.

In alternative embodiments the passive damper may be any device providing a damping effect for the movements or deformations of the grid plate 6.

In another embodiment, the damper may be an active damper comprising one or more sensors configured to measure the position of the grid plate 6 and one or more actuation devices or actuators configured to damp any displacements of the grid plate 6 with respect to the metro-frame 3.

It has been found that a passive or active damper provides in particular efficient compensation of displacements, i. e. movements or deformations, of the grid plate 3 in the resonance frequencies of the grid plate 6, although the damper may also provide an adequate damping in other frequency ranges.

In the embodiment of FIGS. 5 and 6, the damper 10 is configured to damp displacements of the grid plate 6 in the vertical direction, i.e. the direction substantially perpendicular to the main plane of the grid plate. Similar provisions may be provided for displacements of the grid plate 6 in other directions, for instance for one or more horizontal directions, i.e. directions substantially parallel to the main plane of the grid plate 6 or any other desired direction.

Furthermore, three dampers 10 are provided which are arranged in a circle. The number of dampers or more general compensators according to one embodiment of the invention and the location thereof can be any suitable arrangement to compensate the movements and/or deformations of the grid plate 6.

Figure 7:
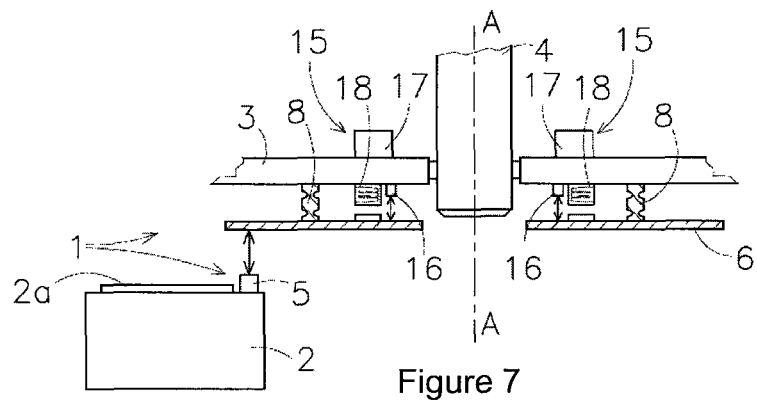
FIG. 7 depicts schematically a side view of a stage apparatus according to an embodiment of the invention.

FIG. 7 shows a measurement system as can be applied in a stage apparatus or lithographic apparatus of one embodiment of the invention. In this embodiment a feedback position control system or controller 15 is provided as a compensator, to control the position of the grid plate 6 with respect to the metro-frame 3. The feedback position control system 15 comprises one or more sensors 16, a controller 17 and one or more actuators 18. The feedback control system is provided to keep the grid plate 6 in substantially the same position with respect to the metro-frame 3. The position control system 15 may further be designed according to any control system known in the field.

The feedback position control system 15 is in the embodiment of FIG. 7 applied to suppress displacements of the grid plate 6 in the vertical direction which is in the drawing in the direction substantially perpendicular to the main plane of the grid plate 6. The position control system 15 may also be applied to suppress displacements in one or more other directions.

It has been found that the provision of a position control system is in particular useful for the suppression of movements or deformations in a low frequency range, i.e. a frequency range lower than the resonance frequency range. However, the provision of a feedback position control system may also be beneficial to suppress displacements of the grid plate 6 in other frequency ranges. In an embodiment, the position control system may be designed to provide both damping in the resonance frequency range as well as position control in the low frequency range.

Figure 8:
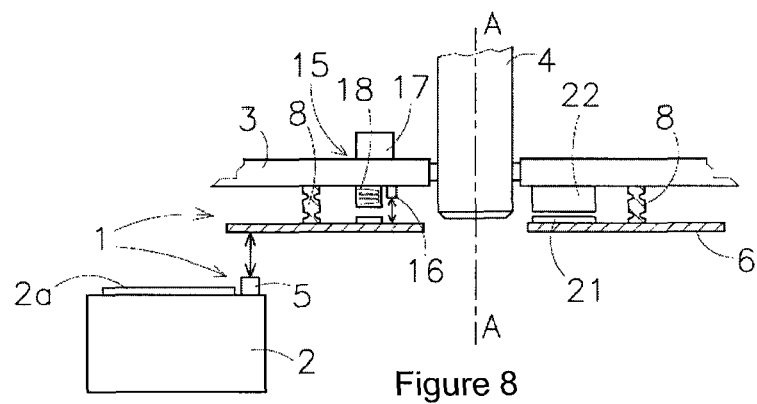
FIG. 8 depicts schematically a side view of a stage apparatus according to an embodiment of the invention.

FIG. 8 shows a measurement system as can be applied in a stage apparatus or lithographic apparatus according to one embodiment of the invention. In this embodiment a passive damper and a feedback position control system 15 of the second embodiment are combined. Both the damper and the position control system 15 are provided to provide suppression of displacements of the grid plate 6 in the direction substantially perpendicular to the main plane of the grid plate 6. The passive damper is in particular provided for suppression of displacement in the resonance frequency range, while the feedback position control system 15 is in particular designed for suppression of displacements in the lower frequency ranges.

The passive damper comprises a first damping element 21 provided on the grid plate and a second damping element 22 mounted on the metro-frame 3. Between the two damping elements 21, 22 a small air gap is formed which functions as a frictionless damping device. The air gap may for instance be 50-150 μm and extends, in one embodiment, over a relatively large area, for instance 200 cm$^2$.

Another type of damper, such as the damper 10 of FIG. 5 or another damper may also be provided. The damping may also be carried out by the position control system 15 as described in relation to the second embodiment.

Similar combination of dampers and/or position control systems may be provided for damping/position control in one or more other directions.

Figure 9:
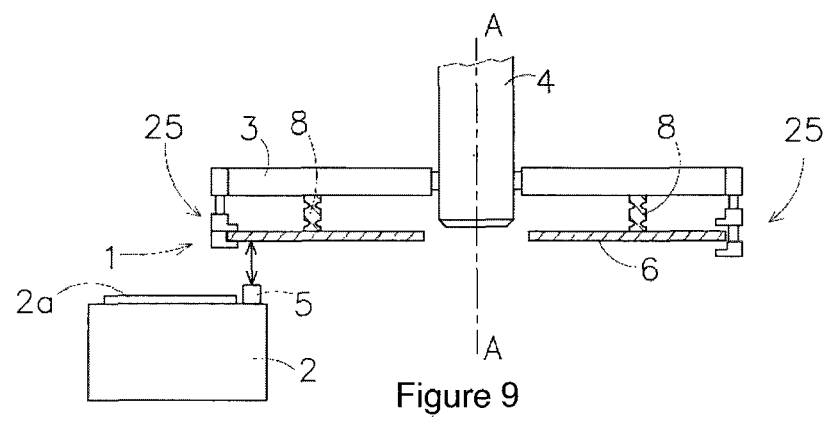
FIG. 9 depicts schematically a side view of a stage apparatus according to an embodiment of the invention.

FIG. 9 shows a measurement system as can be applied in a stage apparatus or lithographic apparatus in accordance with one embodiment. In this embodiment, the measurement system comprises a gripping device or gripper 25 which is mounted on the metro-frame and is movable between two positions, the holding position and the free position. In the holding position, shown at the left side of FIG. 9, the grid plate 6 is fixed in at least the direction substantially perpendicular to the main plane of the grid plate 6. In the free position, shown at the right side of FIG. 9, the gripping device does not hold the grid plate 6 and there is preferably no physical contact between the gripping device 25 and the grid plate 6.

As explained above, the flexure elements 8 are provided to compensate movements of the metro-frame with respect to the grid plate 6. For this reason it is in general undesirable to provide a mounting device which fixes the grid plate 6 in six degrees of freedom since relative movements of the metro-frame 3 would be transferred to the grid plate 6. However, the movements of the metro-frame, in particular when caused by temperature changes or differences, are relative slow.

Furthermore, the high accuracy of the measurement system is in particular desired during scanning movements of the substrate stage, i.e. during scanning or exposure of a substrate. The gripping device 25 according to can be used to fix the grid plate 6 during the scanning movements of the substrate stage to substantially suppress movements or deformations of the grid plate due to external disturbances during these scanning movements. Before and after the a scanning movement, the gripping devices 25 can be placed in the free position so that any shape changes of the metro-frame 3 can be compensated between two scanning movements. In this way both the disturbances in the metro-frame 3 and external disturbances on the grid plate 3 for instance caused by pressure waves can be compensated, and thus the accuracy of the measurement system is increased.

The term gripping device as used in this application refers to any device capable of substantially fixing the grid plate 6 in at least one direction during a certain time period and releasing the grid plate 6 during another time period.

In this embodiment, the gripping device 25 is used as a fixing device to fix the position of the grid plate 6 in at least the direction substantially perpendicular to the main plane of the grid plate. In other embodiments the gripping device 25 may also be designed to fix the grid plate in more directions or other direction(s). In an embodiment one or more gripping devices are provided which are configured to fix in the holding position the grid plate in six degrees of freedom.

In alternative embodiments of the invention the measurement system may comprise two or more grid plates which are arranged in substantially the same plane which take over the function of one large grid plate. Each of these grid plates may be provided with a compensation device as described in this application.

In other embodiments, the one or more sensors may be arranged on the substantially stationary frame while the grid plate or grid plates are arranged on the object table. In such embodiments a compensator may be provided for each grid plate to compensate for movements and/or deformations of the grid plate with respect to the movable object. Such movements/deformations may be caused by disturbances, such as pressure waves due to the movement of the movable object. Such other embodiments are deemed to fall within the scope of the present invention.

In the above description, the compensation of movements and/or deformations of the grid plate with respect to the metro-frame of a lithographic apparatus has been described. The compensator may also be used for the compensation of movements or displacements of other system parts of measurement systems with respect to the frame on which the respective system part is mounted. Such embodiments fall within the scope of the present invention.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A stage apparatus for positioning an object table relative to a substantially stationary frame, the stage apparatus comprising:
   an object table;
   a positioning device configured to position the object table relative to a substantially stationary frame;
   a measurement system configured to provide a first position dependent signal of the object table, said measurement system comprising:
      a first measurement system part mounted on said object table, and
      a second measurement system part mounted on the substantially stationary frame, wherein, in use, the first and second measurement system parts co-operate with each other to provide the first position dependent signal;
   a controller configured to generate a control signal to control the positioning device;
   a mounting device configured to mount said second measurement system part on said substantially stationary frame; and
   a position sensor configured to measure a displacement between the mounting device and the substantially stationary frame and to provide a second position dependent signal representing a position of the second measurement system part relative to the substantially stationary frame based on the measured displacement between the mounting device and the substantially stationary frame,
   wherein the controller is constructed and arranged to receive, at an input terminal thereof, the first and second position dependent signals, and wherein the control signal is based on both the first and second position dependent signals.

2. The stage apparatus of claim 1, wherein the controller is constructed and arranged to apply the second position dependent signal to adjust the first position dependent signal.

3. The stage apparatus of claim 1, wherein the measurement system is an encoder measurement system, the second measurement system part comprising a sensor or a sensor array and the first measurement system part comprising a sensor target object comprising a grating or grid.

4. The stage apparatus of claim 1, wherein the measurement system is an encoder measurement system, the first measurement system part comprising at least one sensor and the second measurement system part comprising a sensor target object comprising a grating or grid.

5. The stage apparatus of claim 4, further comprising a compensator configured to at least partially compensate movements and/or deformations of said second measurement system part with respect to the substantially stationary frame.

6. The stage apparatus of claim 5, wherein said compensator comprises a damper configured to damp the movements and/or deformations of said sensor target object.

7. The stage apparatus of claim 6, wherein said damper is a passive damper or an active damper.

8. The stage apparatus of claim 5, wherein said compensator comprises a feedback position control system.

9. The stage apparatus of claim 5, wherein said compensator comprises a damper configured to compensate substantially in a resonance frequency range of said sensor target object and a position controller configured to compensate substantially in a frequency range lower than said resonance frequency range.

10. The stage apparatus of claim 1, wherein the position sensor comprises one or more capacitive sensors configured to provide the second position dependent signal.

11. The stage apparatus of claim 1, wherein the position sensor is a pressure sensor.

12. The stage apparatus of claim 1, wherein the position sensor comprises a capacitive sensor, a pressure sensor or an accelerometer configured to provide the second position dependent signal.

13. A lithographic apparatus comprising:
   an illumination system configured to condition a radiation beam;
   a patterning device support constructed to support a patterning device, the patterning device being capable of imparting the radiation beam with a pattern in its cross-section to form a patterned radiation beam;
   a substrate table constructed to hold a substrate;
   a projection system configured to project the patterned radiation beam onto a target portion of the substrate;
   a positioning device configured to position the substrate table or patterning device support relative to a substantially stationary frame to which the projection system is mounted;
   a measurement system configured to provide a first position dependent signal of the substrate table or patterning device support, said measurement system comprising:
      a first measurement system part mounted on the substrate table or patterning device support;
      a second measurement system part mounted on the substantially stationary frame, wherein, in use, the first and second measurement system parts co-operate with each other to provide the first position dependent signal;
   a controller configured to generate a control signal to control the positioning device;
   a mounting device configured to mount said second measurement system part on said substantially stationary frame,
   a position sensor configured to measure a displacement between the mounting device and the substantially stationary frame and to provide a second position dependent signal representing a position of the second measurement system part relative to the substantially stationary frame based on the measured displacement between the mounting device and the substantially stationary frame,
   wherein the controller is constructed and arranged to receive, at an input terminal thereof, the first and second position dependent signals, and wherein the control signal is based on both the first and second position dependent signal.

14. The lithographic apparatus of claim 13, wherein said measurement system is an encoder measurement system.

15. The lithographic apparatus of claim 13, wherein the position sensor is a pressure sensor.

16. The lithographic apparatus of claim 13, wherein the position sensor comprises a capacitive sensor, a pressure sensor or an accelerometer configured to provide the second position dependent signal.

17. A method of positioning an object table relative to a substantially stationary frame using a positioning device configured to position the object table and a measurement system comprising a first measurement system part and a second measurement system part that are configured to co-operate with each other to provide a first position dependent signal of the object table, the method comprising:
  providing a first position dependent signal representing a position of the first measurement system part mounted on said object table relative to the second measurement system part mounted, with a mounting device, on the substantially stationary frame;
  measuring, with a position sensor, a displacement between the mounting device and the substantially stationary frame and providing a second position dependent signal representing a position of the second measurement system part relative to the substantially stationary frame based on the measured displacement between the mounting device and the substantially stationary frame;
  providing the first and second position dependent signals at an input terminal of a controller to control the positioning device; and
  providing, by the controller, a control signal for controlling the positioning device,
  wherein the control signal is based on both the first and second position dependent signals.

18. The method of claim 17, further comprising at least partly compensating movements and/or deformations of said second measurement system part with respect to said substantially stationary frame.

19. The method of claim 18, wherein said compensating comprises damping movements and/or deformations of said second measurement system part.

20. The method of claim 17, wherein the position sensor is a pressure sensor.

21. The method of claim 17, wherein the position sensor comprises a capacitive sensor, a pressure sensor or an accelerometer configured to provide the second position dependent signal.

* * * * *